(12) United States Patent
Ueda

(10) Patent No.: US 11,036,143 B2
(45) Date of Patent: Jun. 15, 2021

(54) EXTREME ULTRAVIOLET LIGHT GENERATION APPARATUS AND ELECTRONIC DEVICE MANUFACTURING METHOD

(71) Applicant: Gigaphoton Inc., Tochigi (JP)

(72) Inventor: Atsushi Ueda, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/849,421

(22) Filed: Apr. 15, 2020

(65) Prior Publication Data

US 2020/0241425 A1 Jul. 30, 2020

Related U.S. Application Data

(63) Continuation of application No. PCT/JP2017/041862, filed on Nov. 21, 2017.

(51) Int. Cl.
*G03F 7/20* (2006.01)
*H05G 2/00* (2006.01)

(52) U.S. Cl.
CPC ...... *G03F 7/70033* (2013.01); *G03F 7/70041* (2013.01); *H05G 2/006* (2013.01); *H05G 2/008* (2013.01)

(58) Field of Classification Search
CPC . G03F 7/70033; G03F 7/70041; H05G 2/006; H05G 2/008
See application file for complete search history.

(56) References Cited

U.S. PATENT DOCUMENTS

2017/0094767 A1 3/2017 Ueda et al.
2017/0238407 A1 8/2017 Nagai et al.

FOREIGN PATENT DOCUMENTS

| JP | 2007-207574 A | 8/2007 |
| JP | 2008-277481 A | 11/2008 |
| JP | 2013-084993 A | 5/2013 |
| WO | 2016/006100 A1 | 1/2016 |
| WO | 2016/098193 A1 | 6/2016 |

OTHER PUBLICATIONS

International Search Report issued in PCT/JP2017/041862; dated Feb. 13, 2018.
International Preliminary Report on Patentability and Written Opinion issued in PCT/JP2017/041862; dated May 26, 2020.

*Primary Examiner* — Nicole M Ippolito
*Assistant Examiner* — Hanway Chang
(74) *Attorney, Agent, or Firm* — Studebaker & Brackett PC

(57) ABSTRACT

An extreme ultraviolet light generation apparatus that generates extreme ultraviolet light by irradiating a target with a pulse laser beam includes: a chamber; a magnet that is positioned outside the chamber and forms a magnetic field (70) inside the chamber; a discharge path (37a) that is opened at a position on an inner wall surface of the chamber where the inner wall surface intersects a central axis of the magnetic field (70) and through which gas inside the chamber is discharged; and a gas supply unit (10a) configured to supply gas into the discharge path (37a) through an inner wall surface of the discharge path.

18 Claims, 10 Drawing Sheets

EXTREME ULTRAVIOLET LIGHT GENERATION APPARATUS AND ELECTRONIC DEVICE MANUFACTURING METHOD

CROSS-REFERENCE TO RELATED APPLICATIONS

The present application is a continuation application of International Application No. PCT/JP2017/041862 filed on Nov. 21, 2017. The content of the application is incorporated herein by reference in its entirety.

BACKGROUND

1. Technical Field

The present disclosure relates to an extreme ultraviolet light generation apparatus and an electronic device manufacturing method.

2. Related Art

Recently, miniaturization of a transfer pattern in optical lithography of a semiconductor process has been rapidly proceeding along with miniaturization of the semiconductor process. Minute fabrication at 70 nm to 45 nm and further minute fabrication at 32 nm or smaller will be requested in the next generation technology. To meet the request for minute fabrication at 32 nm or smaller, for example, it is desired to develop an exposure apparatus including an extreme ultraviolet light generation apparatus that generates extreme ultraviolet (EUV) light at a wavelength of 13 nm approximately in combination with reduced projection reflective optics.

Proposed EUV light generation apparatuses include three kinds of apparatuses of a laser produced plasma (LPP) apparatus that uses plasma generated by irradiating a target material with a pulse laser beam, a discharge produced plasma (DPP) apparatus that uses plasma generated by electrical discharge, and a synchrotron radiation (SR) apparatus that uses synchrotron radiation.

LIST OF DOCUMENTS

Patent Document
Patent Document 1: US Published Patent Application No. 2017/0238407

SUMMARY

An extreme ultraviolet light generation apparatus according to an aspect of the present disclosure generates extreme ultraviolet light by irradiating a target with a pulse laser beam and includes: a chamber; a magnet positioned outside the chamber, the magnet forming a magnetic field inside the chamber; a discharge path that is opened at a position on an inner wall surface of the chamber where the inner wall surface intersects a central axis of the magnetic field and through which gas inside the chamber is discharged; and a gas supply unit configured to supply gas into the discharge path through an inner wall surface of the discharge path.

An electronic device manufacturing method according to another aspect of the present disclosure includes: generating extreme ultraviolet light by irradiating a target with a pulse laser beam in an extreme ultraviolet light generation apparatus including a chamber, a magnet positioned outside the chamber, the magnet forming a magnetic field inside the chamber, a discharge path that is opened at a position on an inner wall surface of the chamber where the inner wall surface intersects a central axis of the magnetic field, gas inside the chamber being discharged through the discharge path, and a gas supply unit configured to supply gas into the discharge path through an inner wall surface of the discharge path; emitting the extreme ultraviolet light to an exposure apparatus; and exposing a photosensitive substrate to the extreme ultraviolet light in the exposure apparatus to manufacture an electronic device.

BRIEF DESCRIPTION OF THE DRAWINGS

Embodiments of the present disclosure will be described below merely as examples with reference to the accompanying drawings.

DESCRIPTION OF EMBODIMENTS

Figure 1:
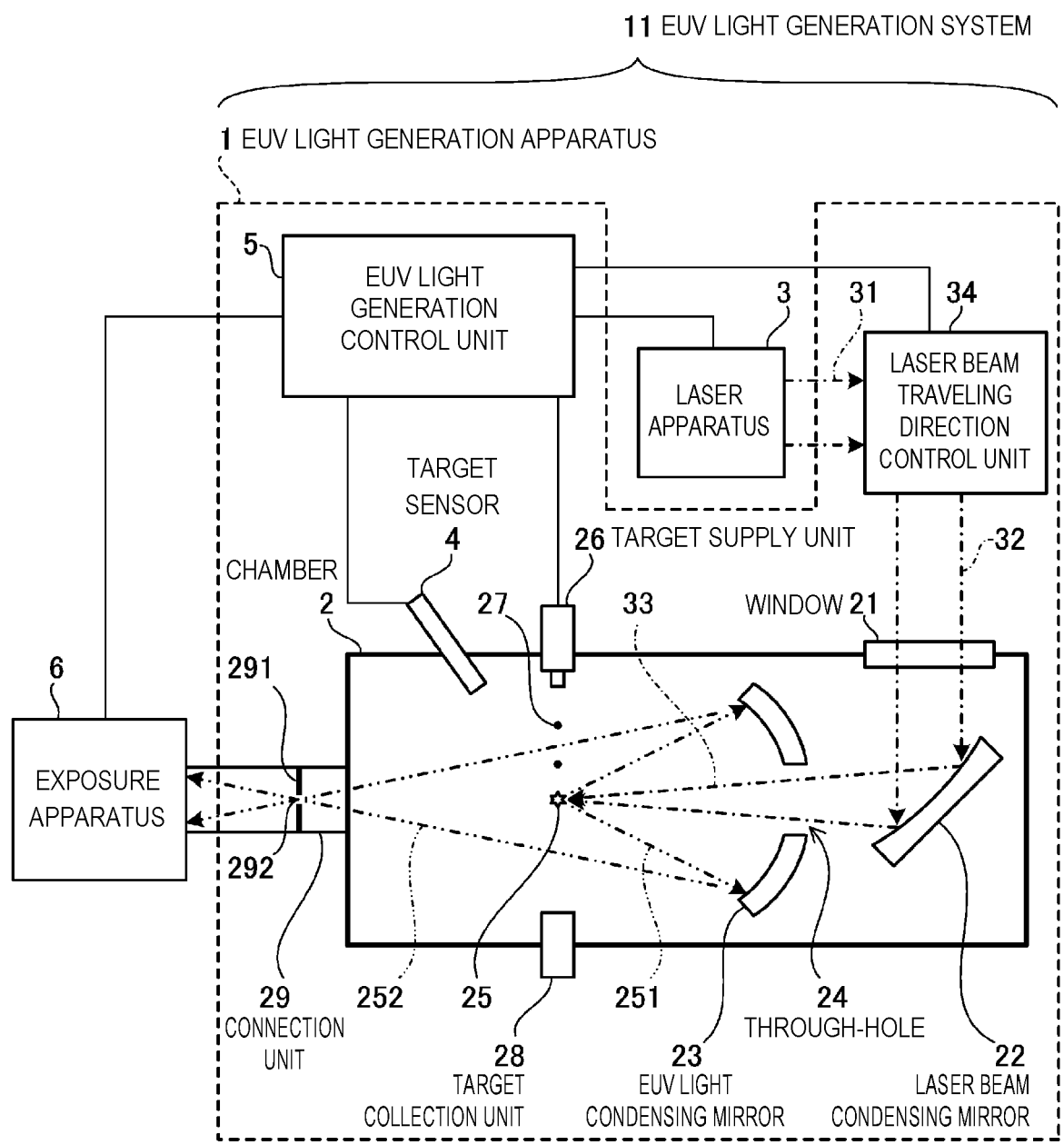
FIG. 1 schematically illustrates the configuration of an exemplary LPP EUV light generation system.

<Contents>
1. Overall description of extreme ultraviolet light generation system
   1.1 Configuration
   1.2 Operation
2. EUV light generation apparatus according to comparative example
   2.1 Configuration
   2.2 Operation
   2.3 Problem
3. EUV light generation apparatus configured to supply gas through inner wall surface of discharge path 37a
   3.1 Configuration
   3.2 Operation and effect
4. Variations of form of inner wall surface of discharge path 37a
   4.1 First modification
   4.2 Second modification
   4.3 Third modification
   4.4 Fourth modification
5. Variations of connection part of gas path 8e and groove
6. Variations of gas supply path to discharge path 37a
7. EUV light generation apparatus configured to cool inner wall surface of discharge path 37a
   7.1 Configuration
   7.2 Operation and effect
8. EUV light generation apparatus in which part of discharge pipe 36 is replaceable
9. Others Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Overall Description of Extreme Ultraviolet Light Generation System 1.1 Configuration FIG. 1 schematically illustrates the configuration of an exemplary LPP EUV light generation system. This EUV light generation apparatus 1 is used together with at least one laser apparatus 3. In the present application, a system including the EUV light generation apparatus 1 and the laser apparatus 3 is referred to as an EUV light generation system 11. As illustrated in FIG. 1 and described below in detail, the EUV light generation apparatus 1 includes a chamber 2 and a target supply unit 26. The chamber 2 is configured to be sealable. The target supply unit 26 is attached to, for example, penetrate through a wall of the chamber 2. The material of a target substance output from the target supply unit 26 includes tin. The material of the target substance may include any combination of tin and terbium, gadolinium, lithium, or xenon.

The wall of the chamber 2 is provided with at least one through-hole. The through-hole is provided with a window 21. A pulse laser beam 32 emitted from the laser apparatus 3 transmits through the window 21. An EUV light condensing mirror 23 having, for example, a spheroidal reflective surface is disposed inside the chamber 2. The EUV light condensing mirror 23 has first and second focal points. For example, a multi-layer reflective film obtained by alternately stacking molybdenum and silicon is formed on the surface of the EUV light condensing mirror 23. The EUV light condensing mirror 23 is disposed so that, for example, the first focal point is positioned in a plasma generation region 25 and the second focal point is positioned at an intermediate focal point (IF) 292. A through-hole 24 is provided at a central part of the EUV light condensing mirror 23. A pulse laser beam 33 passes through the through-hole 24.

The EUV light generation apparatus 1 includes, for example, an EUV light generation control unit 5 and a target sensor 4. The target sensor 4 has an imaging function and is configured to detect the existence, locus, position, speed, and the like of a target 27.

In addition, the EUV light generation apparatus 1 includes a connection unit 29 that provides communication between the inside of the chamber 2 and the inside of an exposure apparatus 6. A wall 291 through which an aperture is formed is provided inside the connection unit 29. The wall 291 is disposed so that the aperture is positioned at the second focal point position of the EUV light condensing mirror 23.

In addition, the EUV light generation apparatus 1 includes, for example, a laser beam traveling direction control unit 34, a laser beam condensing mirror 22, and a target collection unit 28 for collecting the target 27. The laser beam traveling direction control unit 34 includes an optical element for defining the traveling direction of a laser beam, and an actuator for adjusting the position, posture, and the like of the optical element.

1.2 Operation

As illustrated in FIG. 1, a pulse laser beam 31 emitted from the laser apparatus 3 passes through the laser beam traveling direction control unit 34 and is incident in the chamber 2 through the window 21 as the pulse laser beam 32. The pulse laser beam 32 travels along at least one laser beam path in the chamber 2 and is reflected by the laser beam condensing mirror 22 and incident on the at least one target 27 as the pulse laser beam 33.

The target supply unit 26 outputs the target 27 toward the plasma generation region 25 inside the chamber 2. The target 27 is irradiated with at least one pulse included in the pulse laser beam 33. Plasma is generated when the target 27 is irradiated with the pulse laser beam, and radiates radiation light 251. The EUV light condensing mirror 23 reflects EUV light included in the radiation light 251 at a reflectance higher than that for light in any other wavelength band. Reflected light 252 including the EUV light reflected by the EUV light condensing mirror 23 is condensed at the intermediate focal point 292 and emitted to the exposure apparatus 6. One target 27 may be irradiated with a plurality of pulses included in the pulse laser beam 33.

The EUV light generation control unit 5 collectively controls the entire EUV light generation system 11. The EUV light generation control unit 5 processes, for example, image data of the target 27 captured by the target sensor 4. In addition, the EUV light generation control unit 5 controls, for example, the output timing of the target 27 and the output direction of the target 27. In addition, the EUV light generation control unit 5 controls, for example, the oscillation timing of the laser apparatus 3, the traveling direction of the pulse laser beam 32, and the focusing position of the pulse laser beam 33. These various kinds of control are merely exemplary, and may include other control as necessary.

2. EUV Light Generation Apparatus According to Comparative Example

2.1 Configuration

Figure 2A:
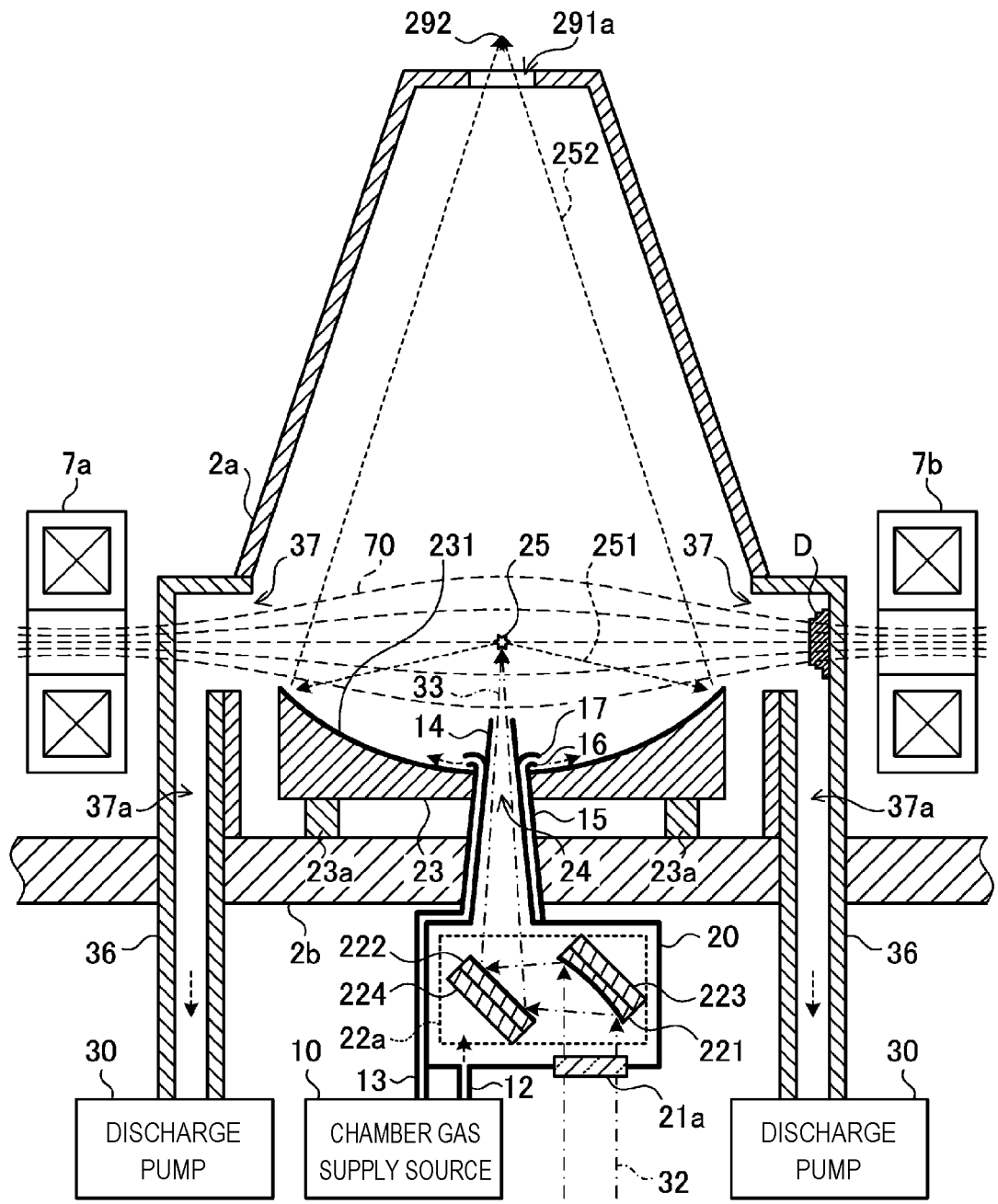
FIG. 2A schematically illustrates the configuration of an EUV light generation apparatus according to a comparative example.
Figure 2B:
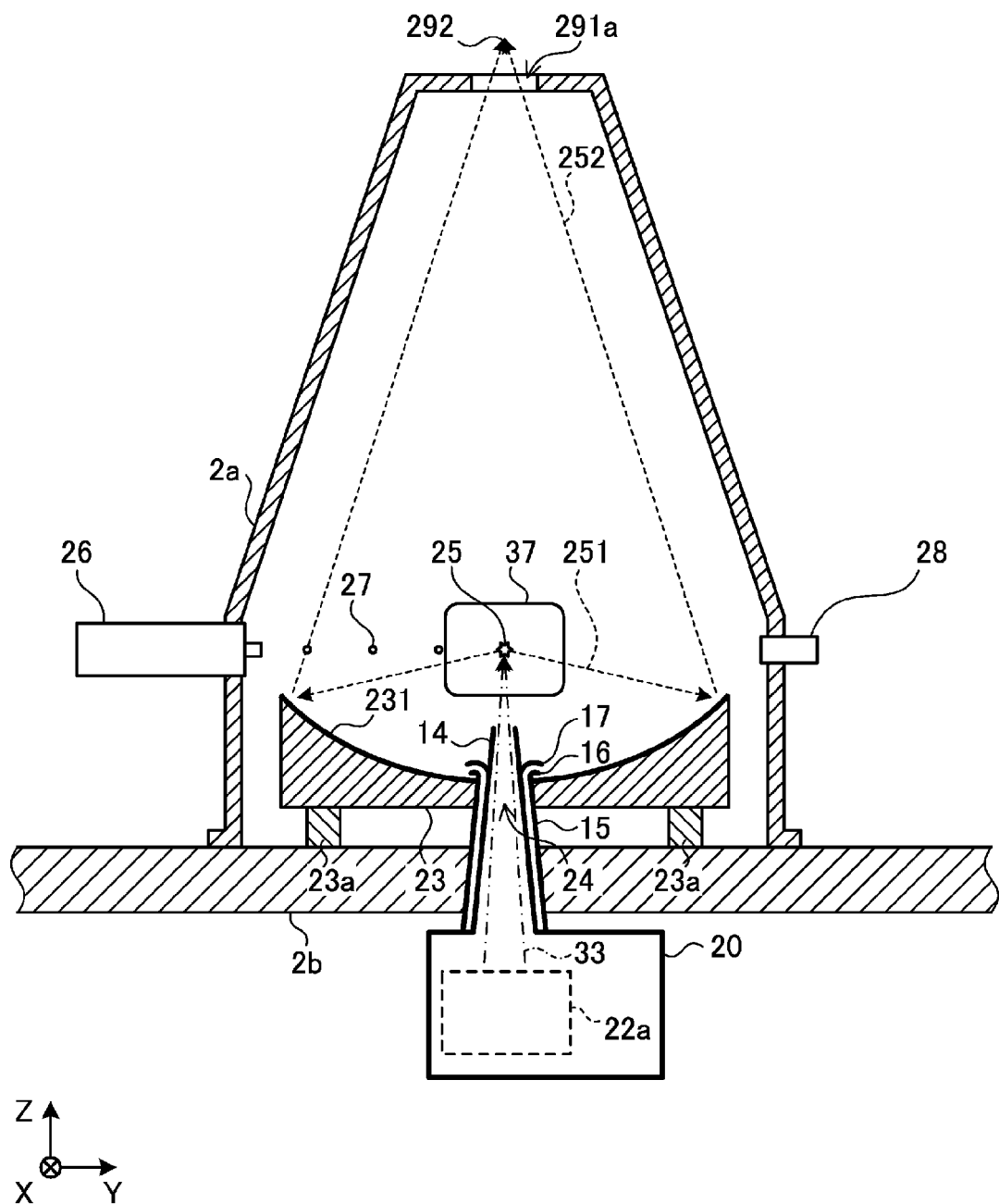
FIG. 2B is a cross-sectional view taken along line IIB-IIB in FIG. 2A.

FIG. 2A schematically illustrates the configuration of the EUV light generation apparatus according to a comparative example. FIG. 2B is a cross-sectional view taken along line IIB-IIB in FIG. 2A. For example, a chamber gas supply source 10, a discharge pump 30, and a planar mirror 222, which are illustrated in FIG. 2A and will be described later, are not illustrated in FIG. 2B.

As illustrated in FIGS. 2A and 2B, a chamber 2a has a wall in a substantially conical shape. An aperture 291a is formed at an end part of the wall of the chamber 2a on a small-diameter side. An end part of the wall of the chamber 2a on a large-diameter side is sealed by and fixed to a first surface of a reference member 2b.

Inside the chamber 2a, the EUV light condensing mirror 23 is supported to the first surface side of the reference member 2b by an EUV light condensing mirror holder 23a. The EUV light condensing mirror 23 has a spheroidal reflective surface on which a multi-layer reflective film 231 is formed. The multi-layer reflective film 231 defines the first focal point and the second focal point. As described above, the first focal point is positioned in the plasma generation region 25, and the second focal point is positioned at the intermediate focal point 292. A central axis in the emitted direction of EUV light from the multi-layer reflective film 231 toward the intermediate focal point 292 is substantially aligned with the positive Z direction. The output direction of the target 27 output from the target supply unit 26 is substantially aligned with the positive Y direction.

A sub chamber 20 is disposed on the second surface side opposite to the first surface of the reference member 2b. The sub chamber 20 is provided with a window 21a through which the pulse laser beam 32 transmits. A laser beam condensing optical system 22a is housed inside the sub chamber 20. The laser beam condensing optical system 22a includes an off-axis parabolic mirror 221 and the planar mirror 222. The off-axis parabolic mirror 221 is supported by a holder 223. The planar mirror 222 is supported by a holder 224.

The sub chamber 20 is connected with a tubular laser beam path wall 14 penetrating through the through-hole 24 of the EUV light condensing mirror 23 and the through-hole of the reference member 2b. The pulse laser beam 33 reflected by the off-axis parabolic mirror 221 and the planar mirror 222 passes inside the laser beam path wall 14.

An outer conical unit 15 is positioned around the laser beam path wall 14. A gap is provided between the outer conical unit 15 and the laser beam path wall 14. The outer conical unit 15 penetrates through the EUV light condensing mirror 23 and the reference member 2b, and includes a barb part 16 extending outward on the reflective surface side of the EUV light condensing mirror 23. A barb part 17 having a gap between the barb part 17 and the barb part 16 is fixed to the outer surface of the laser beam path wall 14. The gap between the outer conical unit 15 and the laser beam path wall 14 and the gap between the barb part 16 and the barb part 17 are connected with each other to form a gas path.

The chamber gas supply source 10 is connected with the sub chamber 20 through a pipe 12. The chamber gas supply source 10 is also connected with the gas path at the gap between the outer conical unit 15 and the laser beam path wall 14 through a pipe 13. The chamber gas supply source 10 includes a gas tank (not illustrated), and a pressure control device or a flow rate control device.

As illustrated in FIG. 2A, magnets 7a and 7b are disposed outside the chamber 2a. The magnets 7a and 7b are each configured by an electromagnet including a superconductive coil. The magnets 7a and 7b are positioned with the plasma generation region 25 interposed therebetween. The respective magnets 7a and 7b are disposed so that the central axes of the superconductive coils thereof are substantially coaxial with each other and pass through the plasma generation region 25. A magnetic field 70 is generated at and around the central axes of the superconductive coils when current flows through the superconductive coils in the same direction. The magnetic field 70 extends to the plasma generation region 25 inside the chamber 2a. The central axis of the magnetic field 70 is substantially aligned with the central axes of the superconductive coils and the X direction.

An exhaust device is attached to the wall of the chamber 2a. The exhaust device includes the discharge pump 30 and a discharge pipe 36. The discharge pipe 36 is configured as the inner wall surface of a discharge path 37a extending from an opening 37 to the discharge pump 30. The discharge pipe 36 has one end connected with the discharge pump 30 and the other end connected with the inside of the chamber 2a in the opening 37. The opening 37 is disposed at a position on the inner wall surface of the chamber 2a where the inner wall surface intersects the central axis of the magnetic field 70. The opening 37 is disposed in each of the gap between the plasma generation region 25 and the magnet 7a and the gap between the plasma generation region 25 and the magnet 7b. The exhaust device also includes a fine particle trapping or a detoxification device (both not illustrated).

2.2 Operation

The target 27 supplied to the plasma generation region 25 is irradiated with the pulse laser beam 33 having passed inside the laser beam path wall 14. Through the irradiation of the target 27 with the pulse laser beam 33, plasma is generated from the target substance and radiates the radiation light 251. Ions of the target substance included in the plasma are likely to diffuse inside the chamber 2a. Some of the ions of the target substance to diffuse inside the chamber 2a are trapped by the magnetic field 70. Thus, it is thought that a large amount of the target substance is distributed around dashed lines illustrated as the magnetic field 70 in FIG. 2A.

The discharge pump 30 performs discharging so that the pressure inside the chamber 2a becomes a predetermined pressure lower than atmospheric pressure. Since the openings 37 are positioned near the magnetic field 70 where a large amount of the target substance is distributed, the exhaust device can efficiently discharge the target substance inside the chamber 2a.

The chamber gas supply source 10 supplies etching gas into the sub chamber 20. Through the supply of the etching gas into the sub chamber 20, the pressure in the sub chamber 20 becomes higher than the pressure in the chamber 2. The etching gas supplied into the sub chamber 20 passes inside the laser beam path wall 14 and flows toward the vicinity of the plasma generation region 25. Accordingly, debris of the target substance can be prevented from entering the sub chamber 20. In addition, any debris of the target substance accumulated on the laser beam condensing optical system 22a in the sub chamber 20 and the window 21a can be removed by the etching gas through etching.

The chamber gas supply source 10 also supplies the etching gas to the gas path at the gap between the outer conical unit 15 and the laser beam path wall 14. Through the gap between the barb part 16 and the barb part 17, the etching gas radially flows from the central part of the EUV light condensing mirror 23 toward the outer periphery side thereof along the surface of the multi-layer reflective film 231 of the EUV light condensing mirror 23.

The flow of the etching gas along the surface of the multi-layer reflective film 231 of the EUV light condensing mirror 23 can prevent debris of the target substance from reaching the surface of the multi-layer reflective film 231 of the EUV light condensing mirror 23. In addition, any debris of the target substance accumulated on the surface of the multi-layer reflective film 231 of the EUV light condensing mirror 23 can be removed by the etching gas through etching.

The etching gas contains hydrogen gas. Part of the hydrogen gas is excited by EUV light and becomes hydrogen radical. When tin is used as the target substance, stannane, which is gas at room temperature, is generated through reaction between hydrogen radical and tin. Accordingly, tin adhered to the surface of the multi-layer reflective film 231 is etched. Alternatively, tin adhesion to the surface of the multi-layer reflective film 231 can be prevented. The stannane is discharged out of the chamber 2a through the openings 37 by the exhaust device.

Stannane is likely to decompose into hydrogen and tin at high temperature, and thus the EUV light condensing mirror 23 is cooled to a predetermined temperature or lower by a cooling device (not illustrated). The predetermined temperature is preferably 60° C. The predetermined temperature may be, for example, 20° C.

2.3 Problem

As described above, gas containing stannane or tin ions is discharged out of the chamber 2a through the discharge path 37a configured by the discharge pipe 36. However, stannane decomposes or tin ions becomes neutralized halfway through the discharging, and solid tin accumulates on the inner wall surface of the discharge path 37a in some cases. In particular, as illustrated in FIG. 2A, solid tin is likely to be accumulated as debris D around a position on the inner wall surface of the discharge path 37a where the inner wall surface intersects the central axis of the magnetic field 70. The right side in FIG. 2A illustrates a case in which the debris D is accumulated, and the left side in FIG. 2A illustrates a case in which no debris D is accumulated for comparison. However, the accumulation of the debris D can occur to any of the two discharge paths 37a.

When the debris D accumulated on the inner wall surface of the discharge path 37a becomes thick, the debris D potentially encumbers discharging through the discharge path 37a. In addition, when a high-energy ion or electron collides with the debris D, tin is sputtered from the debris D and returned into the chamber 2a and potentially contaminates the multi-layer reflective film 231 of the EUV light condensing mirror 23.

In embodiments described below, debris accumulation on the inner wall surface of the discharge path 37a is prevented by supplying gas into the discharge path 37a through the inner wall surface of the discharge path 37a.

Figure 3A:
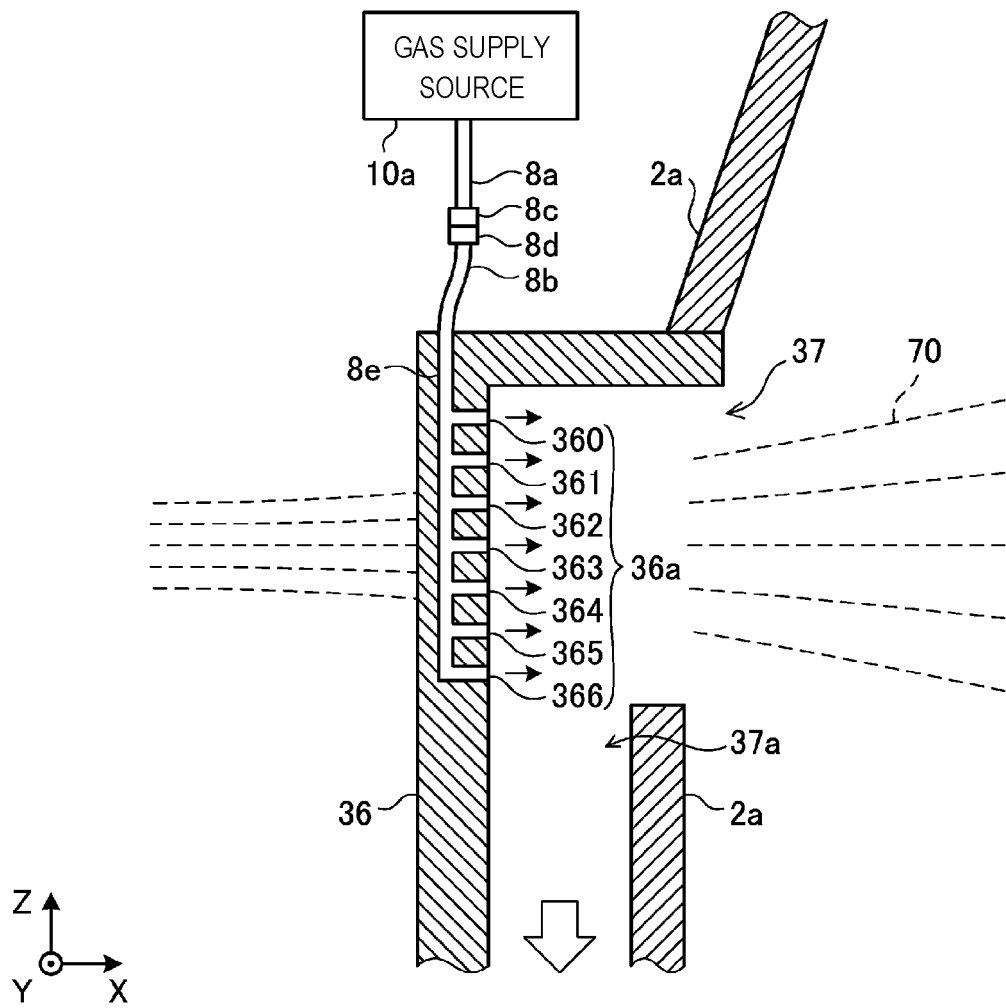
FIG. 3A is an enlarged cross-sectional view of the configuration of an opening 37 and the vicinity thereof in the EUV light generation apparatus according to a first embodiment of the present disclosure.
Figure 3B:
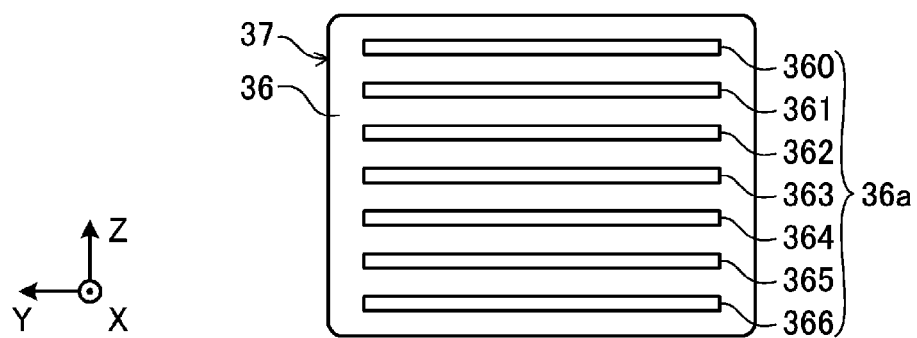
FIG. 3B is a diagram when the inner wall surface of a discharge path 37a is viewed from inside a chamber 2a through the opening 37 in the first embodiment.

3. EUV Light Generation Apparatus Configured to Supply Gas Through Inner Wall Surface of Discharge Path 37a 3.1 Configuration FIG. 3A is an enlarged cross-sectional view of the configuration of each opening 37 and the vicinity thereof in the EUV light generation apparatus according to a first embodiment of the present disclosure. FIG. 3B is a diagram when the inner wall surface of the discharge path 37a is viewed from inside the chamber 2a through the opening 37 in the first embodiment.

In a section illustrated in FIG. 2A, it is illustrated as if part of the wall of the chamber 2a and part of the discharge pipe 36 planarly contact each other near the end part of the wall of the chamber 2a on the large-diameter side. However, the inside of the chamber 2a and the inside of the discharge path 37a do not necessarily need to be divided from each other by both the wall of the chamber 2a and the discharge pipe 36, but may be divided from each other by any one of the wall of the chamber 2a and the discharge pipe 36.

For example, as illustrated in FIG. 3A, the inside of the chamber 2a and the inside of the discharge path 37a may be divided from each other by the wall of the chamber 2a. In this case, the inner wall surface of the discharge path 37a is configured by part of the wall of the chamber 2a and the discharge pipe 36.

Alternatively, the inside of the chamber 2a and the inside of the discharge path 37a may be divided from each other by the discharge pipe 36. In this case, the inner wall surface of the discharge path 37a is configured by the discharge pipe 36.

The EUV light generation apparatus according to the first embodiment includes a gas supply unit to supply gas into the discharge path 37a. The gas supply unit includes a gas supply source 10a, gas supply tubes 8a and 8b, and a gas path 8e. The gas supply tube 8a has one end connected with the gas supply source 10a, and the other end provided with a coupling part 8c. The gas supply tube 8b has one end provided with a coupling part 8d, and the other end connected with the gas path 8e formed in the discharge pipe 36. The coupling part 8c and the coupling part 8d are detachably coupled with each other.

A plurality of grooves 36a are formed in the inner wall surface of the discharge path 37a. The grooves 36a include grooves 360 to 366. The grooves 360 to 366 each have a shape that is long in the Y direction. The grooves 36a are formed around a position on the inner wall surface of the discharge path 37a where the inner wall surface intersects the central axis of the magnetic field 70. The grooves 36a are connected with the gas path 8e.

The gas supply source 10a includes a gas tank (not illustrated), and a pressure control device or a flow rate control device.

The gas supply source 10a may be prepared separately from the chamber gas supply source 10. In this case, the gas supply source 10a may supply gas containing the etching gas or may supply inert gas. The inert gas may be, for example, helium gas or argon gas.

Alternatively, the gas supply source 10a may use a gas tank shared with the chamber gas supply source 10. In this case, the gas supply source 10a supplies gas containing the etching gas. When the gas supply source 10a supplies gas containing the etching gas, any debris accumulated on the inner wall surface of the discharge path 37a is expected to be etched by the etching gas supplied from the gas supply source 10a. The etching gas may contain hydrogen gas.

The other features are same as those of the comparative example.

3.2 Operation and Effect

In parallel to EUV light generation inside the chamber 2a, the gas supply source 10a supplies gas into the discharge path 37a through the inner wall surface of the discharge path 37a. The gas supply source 10a supplies gas to each of the two discharge paths 37a described with reference to FIG. 2A through the inner wall surface thereof. The amounts of gas supplied to the two discharge paths 37a are preferably substantially equal to each other.

The amount of gas supplied from the gas supply source 10a through the inner wall surface of each discharge path 37a is preferably smaller than the amount of etching gas supplied from the chamber gas supply source 10 into the chamber 2a.

The amount of gas supplied from the gas supply source 10a through the inner wall surface of each discharge path 37a is preferably 1/40 to 1/5 inclusive of the amount of etching gas supplied from the chamber gas supply source 10 into the chamber 2a.

The amount of gas supplied from the gas supply source 10a through the inner wall surface of each discharge path 37a is preferably, for example, 5 slm to 20 slm inclusive. In this case, the sum of the amounts of gas supplied through the inner wall surfaces of the two discharge paths 37a may be 10 slm to 40 slm inclusive.

The amount of etching gas supplied from the chamber gas supply source 10 into the chamber 2a may be 100 slm to 200 slm inclusive.

The expression "X slm" means X liters per minute converted under one atmospheric pressure at 0° C.

In parallel to EUV light generation inside the chamber 2a, the discharge pump 30 performs a discharge operation. Gas containing stannane or tin ions inside the chamber 2a is discharged through each discharge path 37a as the discharge pump 30 performs the discharge operation. In addition, the gas supply source 10a supplies gas through the grooves 36a formed in the inner wall surface of the discharge path 37a, thereby decreasing the concentration of stannane or the concentration of tin ions near the grooves 36a. Accordingly, solid tin is prevented from being accumulated on the inner wall surface of the discharge path 37a through stannane decomposition or tin ion neutralization.

The gas supplied from the gas supply source 10a is ejected in the direction from the grooves 36a toward the opening 37, in other words, the X direction. Thereafter, the gas flows in the direction of discharging by the discharge pump 30, in other words, the negative Z direction in accordance with the discharge operation of the discharge pump 30.

The amount of gas supplied through each groove 36a may be equal or different between the grooves 36a. For example, when gas in a first amount is supplied through the grooves 365 and 366 and the like, which are relatively close to the discharge pump 30, gas in a second amount larger than the first amount may be supplied through the grooves 360 and 361 and the like, which are relatively far from the discharge pump 30. It is thought that the gas supplied through the grooves 360 and 361 and the like is ejected in the X direction and then flows in the negative Z direction and passes near the grooves 365 and 366. Thus, the gas supplied through the grooves 360 and 361 and the like is expected to contribute to prevention of debris accumulation near the grooves 365 and 366 even when the amount of gas supplied through the grooves 365 and 366 and the like is small.

Figure 4:
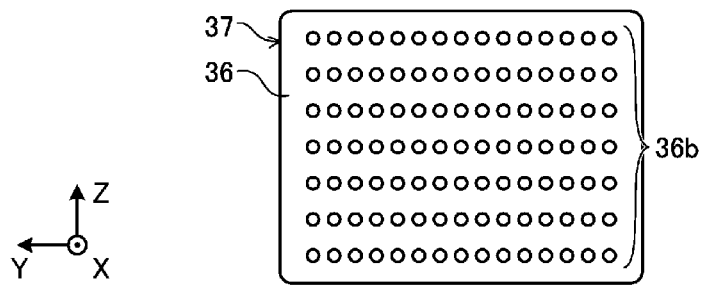
FIG. 4 illustrates the form of the inner wall surface of the discharge path 37a in a first modification.

4. Variations of Form of Inner Wall Surface of Discharge Path 37a 4.1 First Modification FIG. 4 illustrates the form of the inner wall surface of each discharge path 37a in a first modification. FIG. 4 illustrates a part corresponding to FIG. 3B in the first embodiment described above. In place of the grooves 36a, a plurality of holes 36b may be formed in the inner wall surface of the discharge path 37a configured by the discharge pipe 36. The holes 36b are connected with the gas path 8e. The holes 36b are preferably disposed so that the interval thereof in the Y direction is shorter than the interval thereof in the Z direction. After ejected in the X direction as described above, the gas flows in the negative Z direction, and thus it is expected that debris accumulation can be prevented even when the interval in the Z direction is large to some extent.

The other features are same as those described with reference to FIGS. 3A and 3B.

4.2 Second Modification

Figure 5:
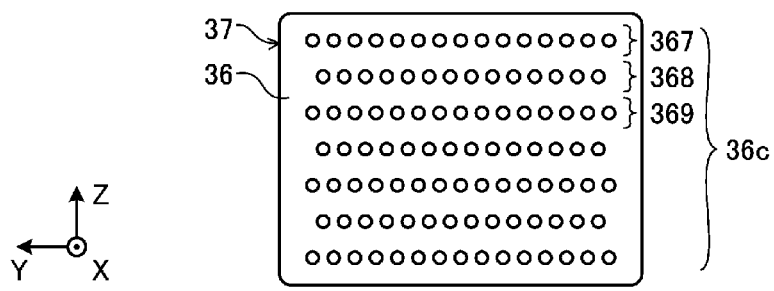
FIG. 5 illustrates the form of the inner wall surface of the discharge path 37a in a second modification.

FIG. 5 illustrates the form of the inner wall surface of each discharge path 37a in a second modification. FIG. 5 illustrates a part corresponding to FIG. 3B in the first embodiment described above. In place of the holes 36b, a plurality of holes 36c may be formed in the inner wall surface of the discharge path 37a configured by the discharge pipe 36. The gas path 8e is opened inside each hole 36c. The holes 36c are arranged in columns including a column 367 and a column 368. The column 367 and the column 368 each include a plurality of holes arranged in the Y direction. In the second modification, the positions of the holes included in the column 367 in the Y direction are shifted from the positions of the holes included in the column 368 in the Y direction. With this configuration, since gas flows in the negative Z direction after ejected in the X direction as described above, gas ejected through the holes included in the column 367 potentially flows near the gap between the holes included in the column 368. Thus, it is expected that debris accumulation can be prevented between the holes included in the column 368 as well. This is same for a column 369 and other columns denoted by no reference signs.

The other features are same as those of the first modification.

4.3 Third Modification

Figure 6:
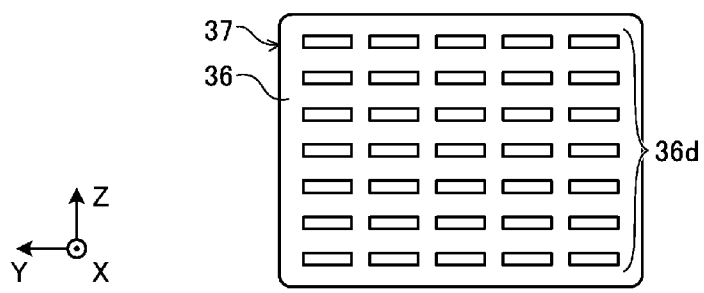
FIG. 6 illustrates the form of the inner wall surface of the discharge path 37a in a third modification.

FIG. 6 illustrates the form of the inner wall surface of each discharge path 37a in a third modification. FIG. 6 illustrates a part corresponding to FIG. 3B in the first embodiment described above. In place of the grooves 36a, a plurality of grooves 36d may be formed in the inner wall surface of the discharge path 37a configured by the discharge pipe 36. The third modification represents the case where each groove 36a is further separated into the grooves 36d. The gas path 8e is opened inside each groove 36d. The grooves 36d are preferably disposed so that the interval thereof in the Y direction is shorter than the interval thereof in the Z direction. Since gas flows in the negative Z direction after ejected in the X direction as described above, it is expected that debris accumulation can be prevented even when the interval in the Z direction is large to some extent.

The other features are same as those described with reference to FIGS. 3A and 3B.

4.4 Fourth Modification

Figure 7:
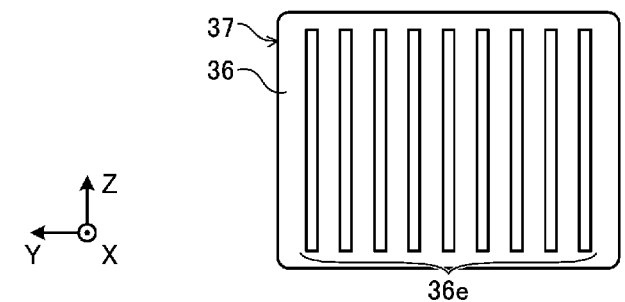
FIG. 7 illustrates the form of the inner wall surface of the discharge path 37a in a fourth modification.

FIG. 7 illustrates the form of the inner wall surface of each discharge path 37a in a fourth modification. FIG. 7 illustrates a part corresponding to FIG. 3B in the first embodiment described above. In place of the grooves 36a, a plurality of grooves 36e may be formed in the inner wall surface of the discharge path 37a configured by the discharge pipe 36. Each groove 36e has a shape that is long in the Z direction.

The other features are same as those described with reference to FIGS. 3A and 3B.

5. Variations of Connection Part of Gas Path 8e and Groove

Figure 8A:
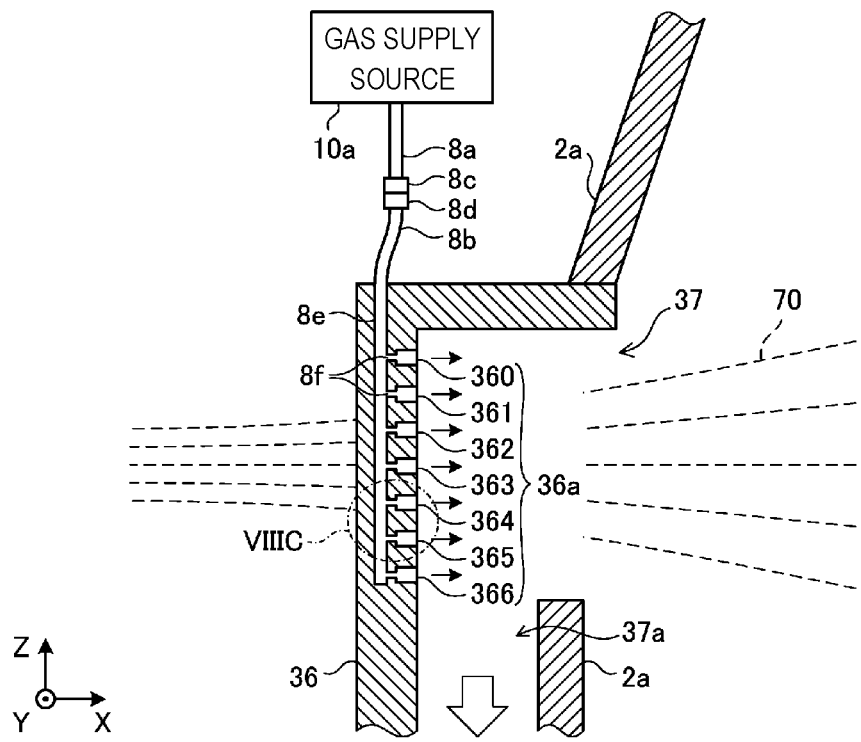
FIG. 8A is an enlarged cross-sectional view of the configuration of the opening 37 and the vicinity thereof in the EUV light generation apparatus according to a second embodiment of the present disclosure.
Figure 8B:
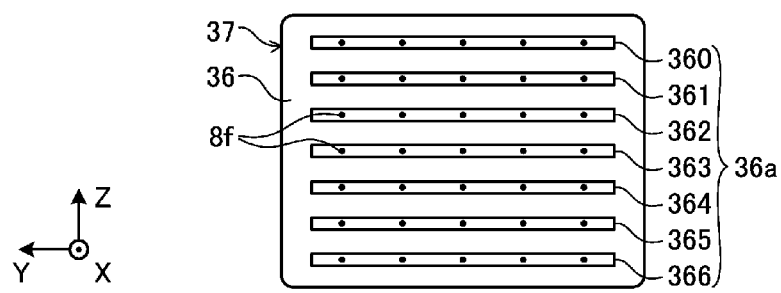
FIG. 8B is a diagram when the inner wall surface of the discharge path 37a is viewed from inside the chamber 2a through the opening 37 in the second embodiment.
Figure 8C:
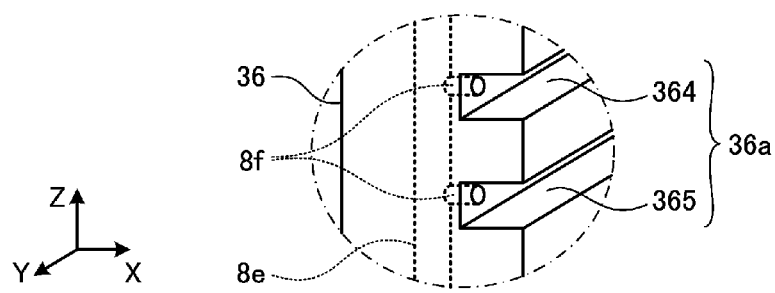
FIG. 8C is an enlarged perspective diagram illustrating a connection part of a gas path 8e and a groove 36a in the second embodiment.

FIG. 8A is an enlarged cross-sectional view of the configuration of each opening 37 and the vicinity thereof in the EUV light generation apparatus according to a second embodiment of the present disclosure. FIG. 8B is a diagram when the inner wall surface of each discharge path 37a is viewed from inside the chamber 2a through the opening 37 in the second embodiment. FIG. 8B illustrates a part corresponding to FIG. 3B in the first embodiment described above. FIG. 8C is an enlarged perspective diagram illustrating a connection part of the gas path 8e and each groove 36a in the second embodiment. FIG. 8C illustrates a part surrounded by ellipse VIIIC in FIG. 8A and the vicinity thereof.

In the second embodiment, the gas path 8e and each groove 36a are connected with each other through small holes 8f. Each small hole 8f has an inner diameter smaller than the inner diameter of the gas path 8e. A plurality of small holes 8f are formed in each groove 36a as illustrated in FIG. 8B.

In the second embodiment, resistance in the flow path of gas from the gas path 8e to the inner wall surface of the discharge path 37a is largest at the small holes 8f. Accordingly, difference between the flow rates of gas passing through the small holes 8f can be reduced.

The other features are same as those of the first embodiment described with reference to FIGS. 3A and 3B. The modifications described with reference to FIGS. 4 to 7 may be employed in place of the grooves 36a.

6. Variations of Gas Supply Path to Discharge Path 37a

Figure 9A:
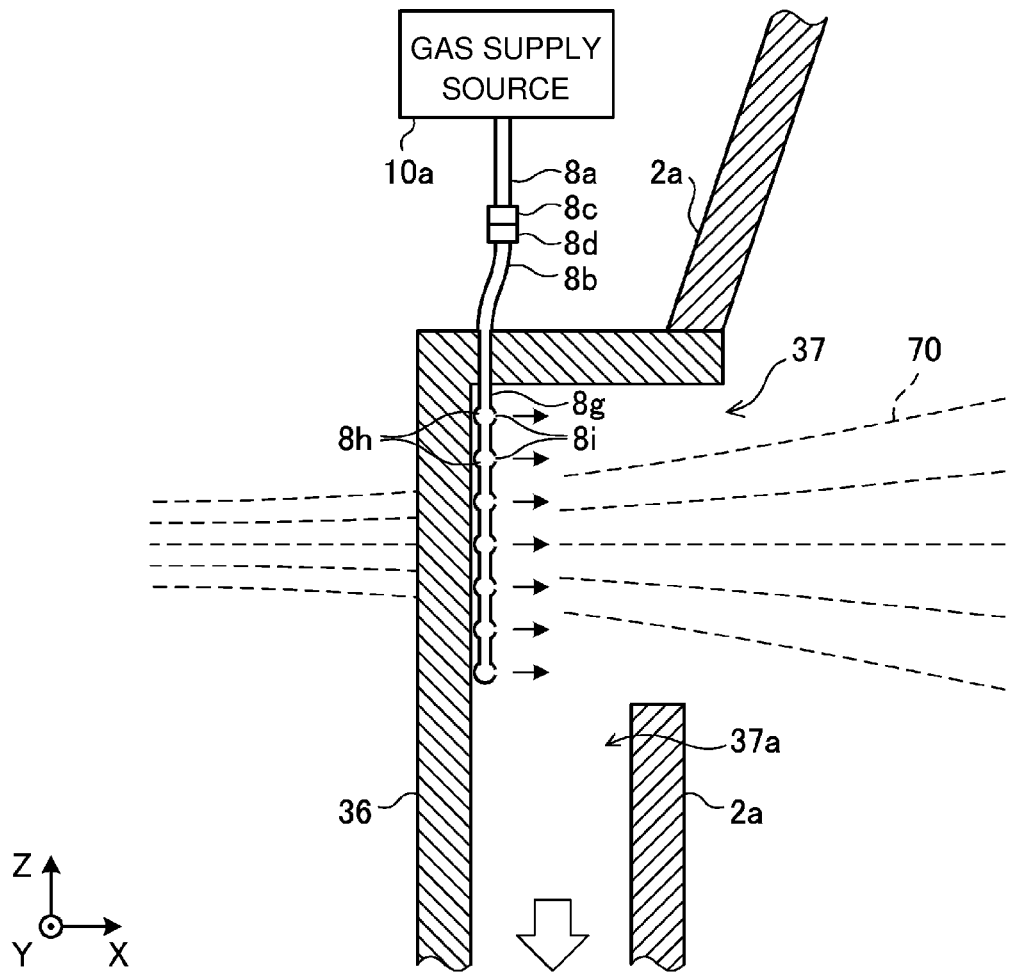
FIG. 9A is an enlarged cross-sectional view of the configuration of the opening 37 and the vicinity thereof in the EUV light generation apparatus according to a third embodiment of the present disclosure.
Figure 9B:
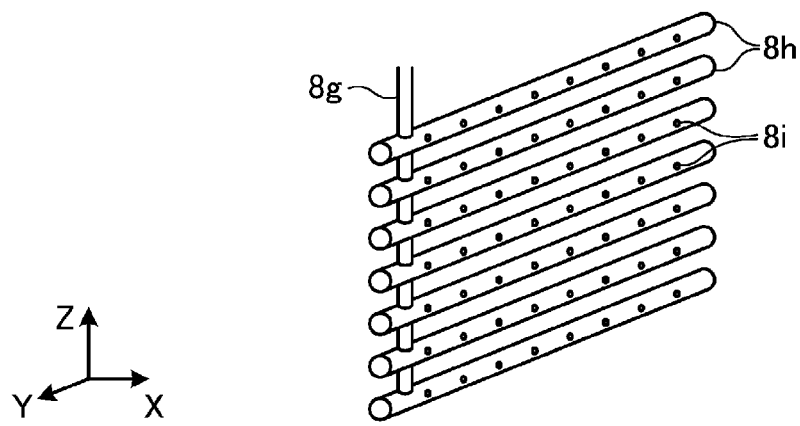
FIG. 9B is a perspective view of a gas supply path disposed along the inner wall surface of the discharge path 37a in the third embodiment.

FIG. 9A is an enlarged cross-sectional view of the configuration of each opening 37 and the vicinity thereof in the EUV light generation apparatus according to a third embodiment of the present disclosure. FIG. 9B is a perspective view of a gas supply path disposed along the inner wall surface of the discharge path 37a in the third embodiment. The gas supply path includes a gas path 8g and a plurality of gas paths 8h.

In the third embodiment, the gas path 8g connected with the gas supply tube 8b penetrates through the wall surface of the discharge pipe 36 and is disposed along the inner wall surface of the discharge path 37a. In addition, the gas paths 8h connected with the gas path 8g are disposed along the inner wall surface of the discharge path 37a. Each gas path 8h includes a plurality of gas ejection ports 8i disposed side by side in the Y direction.

Gas supplied from the gas supply source 10a is ejected through the gas path 8g and the gas paths 8h in the direction from the gas ejection ports 8i to the opening 37, in other words, the X direction. Thereafter, the gas flows in the direction of discharge by the discharge pump 30, in other words, the negative Z direction in accordance with the discharge operation of the discharge pump 30.

In the third embodiment as well, debris can be prevented from being accumulated on the inner wall surface of the discharge path 37a in effect by supplying gas into the discharge path 37a through the inner wall surface of the discharge path 37a.

According to the third embodiment, the gas supply path can be relatively easily fabricated.

The other features are same as those of the first embodiment described with reference to FIGS. 3A and 3B.

Figure 10A:
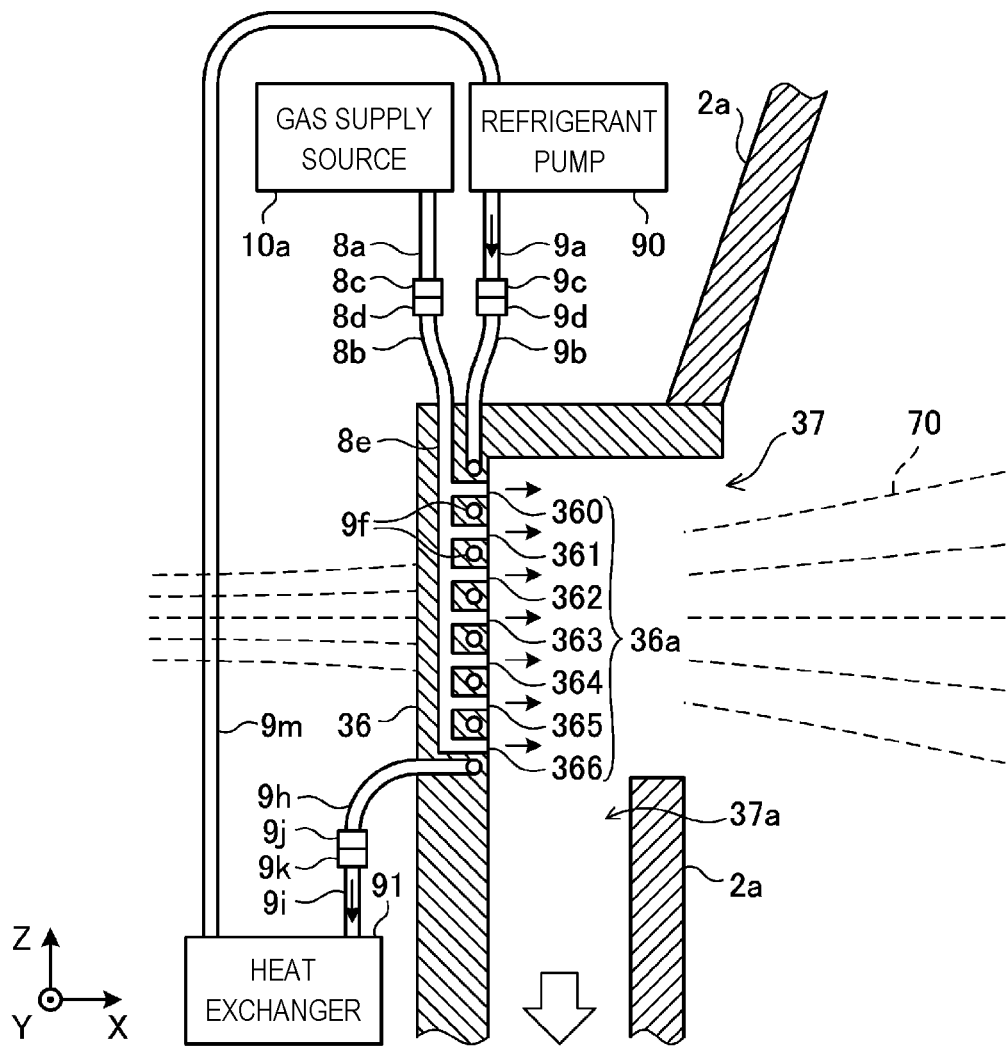
FIG. 10A is an enlarged cross-sectional view of the configuration of the opening 37 and the vicinity thereof in the EUV light generation apparatus according to a fourth embodiment of the present disclosure.
Figure 10B:
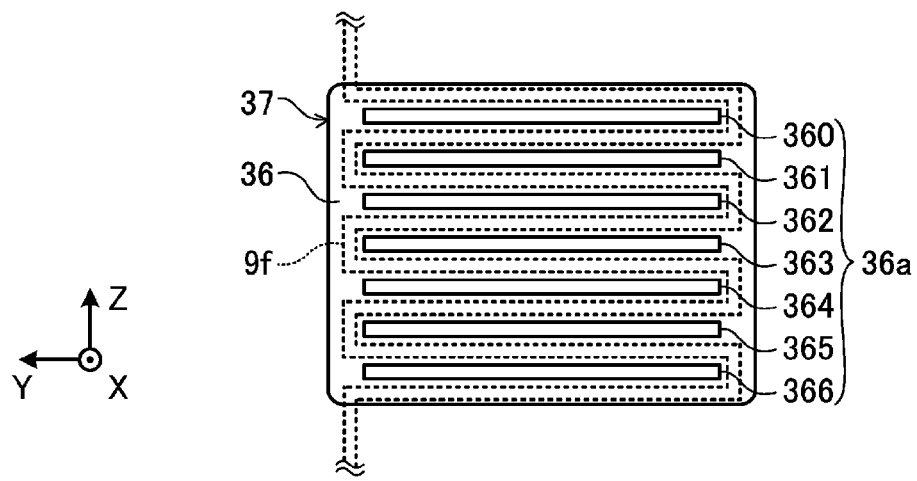
FIG. 10B is a diagram when the inner wall surface of the discharge path 37a is viewed from inside the chamber 2a through the opening 37 in the fourth embodiment.

7. EUV Light Generation Apparatus Configured to Cool Inner Wall Surface of Discharge Path 37a 7.1 Configuration FIG. 10A is an enlarged cross-sectional view of the configuration of each opening 37 and the vicinity thereof in the EUV light generation apparatus according to a fourth embodiment of the present disclosure. FIG. 10B is a diagram when the inner wall surface of the discharge path 37a is viewed from inside the chamber 2a through the opening 37 in the fourth embodiment.

The EUV light generation apparatus according to the fourth embodiment includes a cooling unit to cool part of the discharge pipe 36 configured as the inner wall surface of the discharge path 37a. The cooling unit includes a refrigerant pump 90, refrigerant supply tubes 9a and 9b, a refrigerant path 9f, refrigerant ejection pipes 9h and 9i, a heat exchanger 91, and a circulation path 9m.

The refrigerant supply tube 9a has one end connected with an exit port of the refrigerant pump 90, and the other end provided with a coupling part 9c. The refrigerant supply tube 9b has one end provided with a coupling part 9d, and the other end connected with the refrigerant path 9f formed in the discharge pipe 36. The coupling part 9c and the coupling part 9d are detachably coupled with each other.

The refrigerant path 9f passes between the grooves 36a. As illustrated in FIG. 10A, the refrigerant path 9f is positioned near the inner wall surface of the discharge path 37a.

The refrigerant ejection pipe 9h has one end connected with the refrigerant path 9f, and the other end provided with a coupling part 9j. The refrigerant ejection pipe 9i has one end provided with a coupling part 9k, and the other end connected with an entrance port of the heat exchanger 91. The coupling part 9j and the coupling part 9k are detachably coupled with each other.

The circulation path 9m connects an exit port of the heat exchanger 91 and an entrance port of the refrigerant pump 90.

7.2 Operation and Effect

In parallel to EUV light generation inside the chamber 2a, the refrigerant pump 90 supplies a cooling medium to the refrigerant path 9f, and the heat exchanger 91 cools the cooling medium having passed through the refrigerant path 9f. The cooling medium may be water or other fluid. Accordingly, the inner wall surface of the discharge path 37a configured by the discharge pipe 36 is cooled. Stannane is likely to decompose at high temperature, but stannane decomposition can be prevented by cooling the inner wall surface of the discharge path 37a, thereby preventing debris accumulation on the inner wall surface of the discharge path 37a. It is also expected that, since the refrigerant path 9f is disposed between the grooves 36a, stannane decomposition and debris accumulation can be prevented by cooling gas passing through the grooves 36a.

The other features are same as those of the first embodiment described with reference to FIGS. 3A and 3B. The modifications described with reference to FIGS. 4 to 7 may be employed in place of the grooves 36a. Alternatively, the second or third embodiment may be employed.

Figure 11:
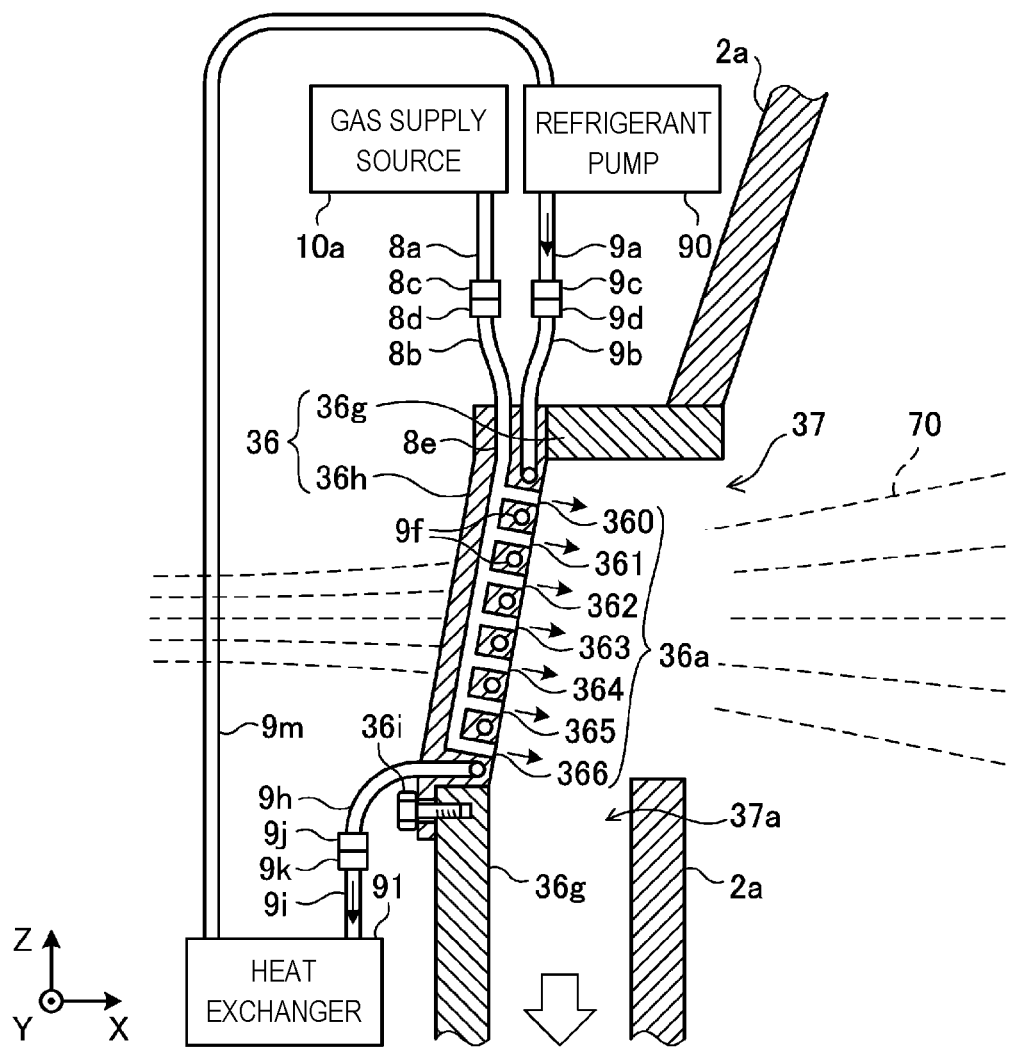
FIG. 11 is an enlarged cross-sectional view of the configuration of the opening 37 and the vicinity thereof in the EUV light generation apparatus according to a fifth embodiment of the present disclosure.

8. EUV Light Generation Apparatus in which Part of Discharge Pipe 36 is Replaceable FIG. 11 is an enlarged cross-sectional view of the configuration of each opening 37 and the vicinity thereof in the EUV light generation apparatus according to a fifth embodiment of the present disclosure.

In the fifth embodiment, the discharge pipe 36 is configured by a first member 36g connected with the wall of the chamber 2a, and a second member 36h in which the gas path 8e, the grooves 36a, and the refrigerant path 9f are formed. The second member 36h is configured to be fixed to the first member 36g in an airtight manner by a plurality of bolts including a bolt 36i or the like. The second member 36h can be removed from the first member 36g by removing the bolts or the like.

The gas path 8e, the grooves 36a, and the refrigerant path 9f may be same as those in the fourth embodiment. In the fifth embodiment, gas is supplied into the discharge path 37a through the inner wall surface of the second member 36h.

The inner wall surface of the second member 36h may be tilted relative to the central axis of the magnetic field 70. Gas ejected through the inner wall surface of the second member 36h can be smoothly discharged when the inner wall surface of the second member 36h is tilted in the direction of discharge by the discharge pump 30 as illustrated in FIG. 11.

According to the fifth embodiment, part of the discharge pipe 36 configured as the discharge path 37a, on which the debris D is likely to accumulate, can be removed and replaced. Accordingly, maintenance can be easily performed, which leads to reduced operation cost.

9. Others

Figure 12:
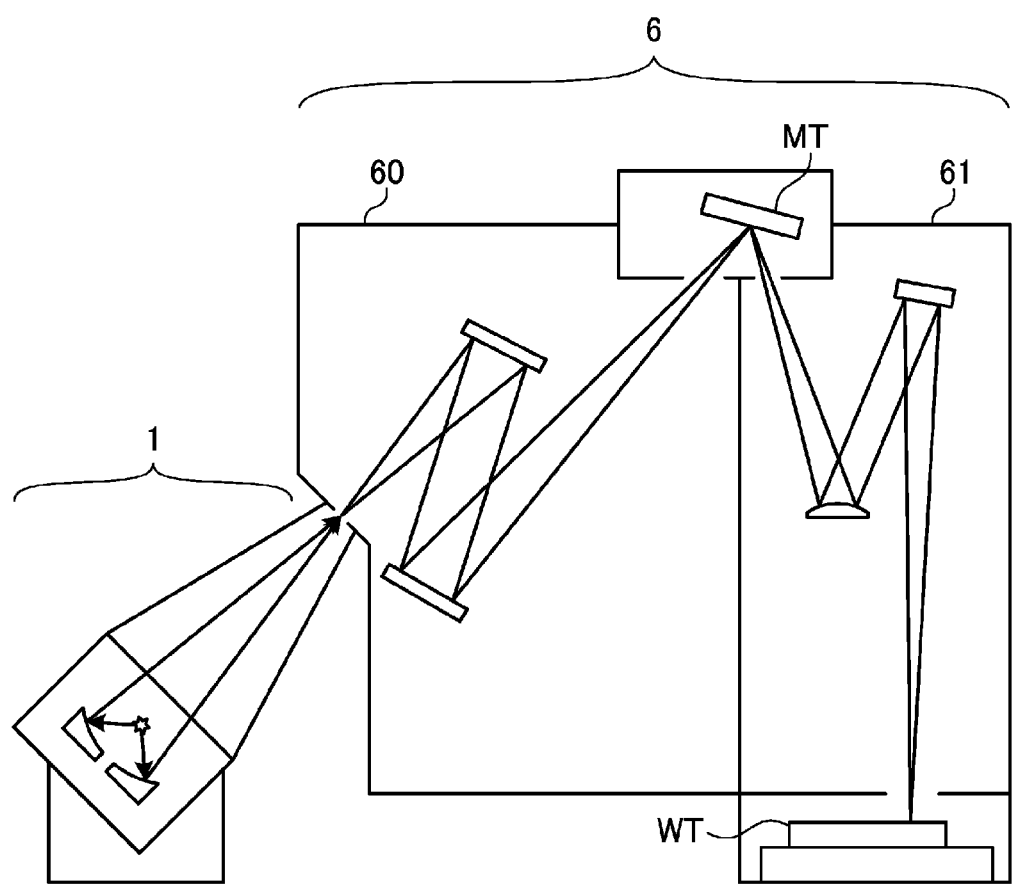
FIG. 12 schematically illustrates the configuration of an exposure apparatus 6 connected with an EUV light generation apparatus 1.

FIG. 12 schematically illustrates the configuration of the exposure apparatus 6 connected with the EUV light generation apparatus 1.

In FIG. 12, the exposure apparatus 6 includes a mask irradiation unit 60 and a workpiece irradiation unit 61. The mask irradiation unit 60 illuminates a mask pattern on a mask table MT with EUV light incident from the EUV light generation apparatus 1 through a reflection optical system. The workpiece irradiation unit 61 images the EUV light reflected by the mask table MT onto a workpiece (not illustrated) disposed on a workpiece table WT through the reflection optical system. The workpiece is a photosensitive substrate such as a semiconductor wafer on which photoresist is applied. The exposure apparatus 6 moves the mask table MT and the workpiece table WT in parallel to each other in synchronization to expose the workpiece to the EUV light having a pattern corresponding to the mask pattern. An electronic device can be manufactured by transferring a device pattern onto the semiconductor wafer through the above-described exposure process.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation apparatus that generates extreme ultraviolet light by irradiating a target with a pulse laser beam, the extreme ultraviolet light generation apparatus comprising:
   a chamber;
   a magnet positioned outside the chamber, the magnet forming a magnetic field inside the chamber;
   a discharge path that is opened at a position on an inner wall surface of the chamber where the inner wall surface intersects a central axis of the magnetic field and through which gas inside the chamber is discharged; and
   a gas supply unit configured to supply gas into the discharge path through an inner wall surface of the discharge path.

2. The extreme ultraviolet light generation apparatus according to claim 1, wherein
   a groove is formed in the inner wall surface of the discharge path, and
   the gas supply unit is opened to the groove.

3. The extreme ultraviolet light generation apparatus according to claim 2, wherein the groove has a shape that is long in a direction different from the direction of discharge in the discharge path.

4. The extreme ultraviolet light generation apparatus according to claim 1, wherein
   a plurality of grooves are formed in the inner wall surface of the discharge path, and
   the gas supply unit is opened to each groove.

5. The extreme ultraviolet light generation apparatus according to claim 1, wherein the gas supply unit supplies gas from around the position on the inner wall surface of the chamber where the inner wall surface intersects the central axis of the magnetic field.

6. The extreme ultraviolet light generation apparatus according to claim 1, wherein gas supplied by the gas supply unit contains hydrogen gas.

7. The extreme ultraviolet light generation apparatus according to claim 1, further comprising a chamber gas supply unit configured to supply gas into the chamber, wherein an amount of gas supplied into the discharge path is smaller than an amount of gas supplied into the chamber.

8. The extreme ultraviolet light generation apparatus according to claim 7, wherein the amount of gas supplied into the discharge path is $1/40$ to $1/5$ inclusive of the amount of gas supplied into the chamber.

9. The extreme ultraviolet light generation apparatus according to claim 1, wherein
   the discharge path is connected with a discharge pump, and
   the gas supply unit supplies gas in a first amount from a first position at the inner wall surface of the discharge path, and supplies gas in a second amount larger than the first amount from a second position at the inner wall surface of the discharge path, the second position being farther from the discharge pump than the first position.

10. The extreme ultraviolet light generation apparatus according to claim 1, wherein the gas supply unit ejects gas through the inner wall surface of the discharge path toward the position at which the discharge path is opened to the inner wall surface of the chamber.

11. The extreme ultraviolet light generation apparatus according to claim 1, wherein
    a hole is formed in the inner wall surface of the discharge path, and
    the gas supply unit is connected with the hole.

12. The extreme ultraviolet light generation apparatus according to claim 1, wherein
    a plurality of holes are formed in the inner wall surface of the discharge path, and
    the gas supply unit is connected with each hole.

13. The extreme ultraviolet light generation apparatus according to claim 1, further comprising a cooling unit configured to cool the inner wall surface of the discharge path.

14. The extreme ultraviolet light generation apparatus according to claim 13, wherein the cooling unit includes a refrigerant path disposed in a member forming the inner wall surface of the discharge path, and a refrigerant pump configured to supply a cooling medium to the refrigerant path.

15. The extreme ultraviolet light generation apparatus according to claim 1, wherein the inner wall surface of the discharge path includes a first member connected with the chamber, and a second member configured to be detachable from the first member.

16. The extreme ultraviolet light generation apparatus according to claim 15, wherein the gas supply unit supplies gas through an inner wall surface of the second member.

17. The extreme ultraviolet light generation apparatus according to claim 1, wherein
   the inner wall surface of the discharge path includes a tilt surface tilted relative to the central axis of the magnetic field, and
   the gas supply unit supplies gas through the tilt surface.

18. An electronic device manufacturing method comprising:
   generating extreme ultraviolet light by irradiating a target with a pulse laser beam in an extreme ultraviolet light generation apparatus including
      a chamber,
      a magnet that is positioned outside the chamber and forms a magnetic field inside the chamber,
      a discharge path that is opened at a position on an inner wall surface of the chamber where the inner wall surface intersects a central axis of the magnetic field and through which gas inside the chamber is discharged, and
      a gas supply unit configured to supply gas into the discharge path through an inner wall surface of the discharge path;
   emitting the extreme ultraviolet light to an exposure apparatus; and
   exposing a photosensitive substrate to the extreme ultraviolet light in the exposure apparatus to manufacture an electronic device.

* * * * *